United States Patent [19]

Zheng et al.

[11] Patent Number: 5,602,053
[45] Date of Patent: Feb. 11, 1997

[54] METHOD OF MAKING A DUAL DAMASCENE ANTIFUSE STRUCTURE

[75] Inventors: Jiazhen Zheng, Singapore, Singapore; Lap Chan, San Francisco, Calif.

[73] Assignee: Chartered Semidconductor Manufacturing Pte, Ltd., Singapore, Singapore

[21] Appl. No.: 628,068

[22] Filed: Apr. 8, 1996

[51] Int. Cl.⁶ .................................... H01L 21/70
[52] U.S. Cl. .................... 437/60; 437/195; 437/922; 257/530; 257/355
[58] Field of Search ................ 437/60, 195, 922; 257/530, 355

[56] References Cited

U.S. PATENT DOCUMENTS

| | | | |
|---|---|---|---|
| 4,796,074 | 1/1989 | Roesner | 357/51 |
| 5,248,632 | 9/1993 | Tung et al. | 437/922 |
| 5,272,101 | 12/1993 | Forouli et al. | 437/922 |
| 5,308,795 | 5/1994 | Hawley et al. | 437/922 |
| 5,322,812 | 6/1994 | Dixit et al. | 437/60 |
| 5,384,481 | 1/1995 | Holzworth et al. | 257/530 |
| 5,391,513 | 2/1995 | Delgado et al. | 437/60 |
| 5,403,778 | 4/1995 | Kwok et al. | 437/188 |
| 5,412,245 | 5/1995 | Farreau | 257/530 |
| 5,427,979 | 6/1995 | Chang | 437/922 |
| 5,440,167 | 8/1995 | Iranmanesh | 257/530 |
| 5,444,022 | 8/1995 | Gardner | 437/192 |
| 5,447,880 | 9/1995 | Lee et al. | 437/60 |
| 5,459,100 | 10/1995 | Choi | 437/192 |
| 5,502,000 | 3/1996 | Look et al. | 437/922 |
| 5,557,136 | 9/1996 | Gordon | 257/530 |

FOREIGN PATENT DOCUMENTS

| | | | |
|---|---|---|---|
| 0685068 | 3/1994 | Japan | 437/922 |
| 6204341 | 7/1994 | Japan | 437/922 |

*Primary Examiner*—Charles L. Bowers, Jr.
*Assistant Examiner*—Lynne A. Gurley
*Attorney, Agent, or Firm*—George O. Saile

[57] ABSTRACT

An improved antifuse design has been achieved by providing a structure includes a pair of alternating layers of silicon nitride and amorphous silicon sandwiched between two dual damascene connectors. Said structure provides the advantage, over the prior art, that all electrically active surfaces of the fuse structure are planar, so no potential failure spots resulting from surface unevenness can be formed. A process for manufacturing said fuse structure is also provided and involves fewer masking steps than related structures of the prior art.

8 Claims, 3 Drawing Sheets

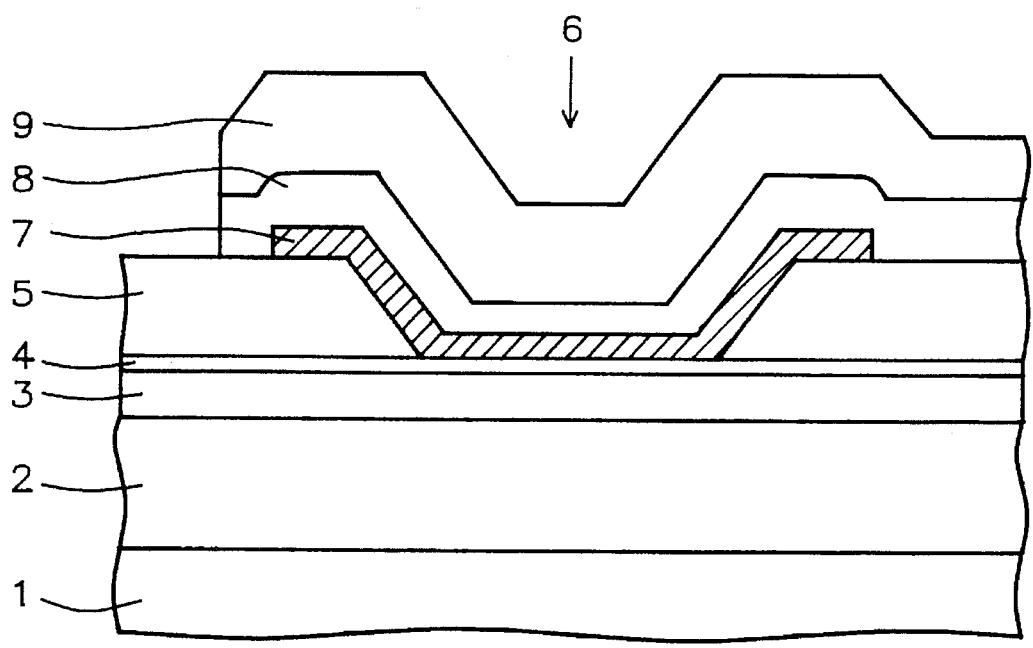
*FIG. 1 - Prior Art*
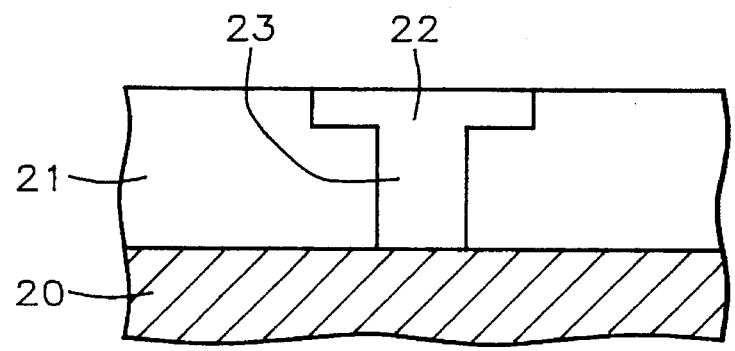
*FIG. 2*

METHOD OF MAKING A DUAL DAMASCENE ANTIFUSE STRUCTURE

BACKGROUND OF THE INVENTION (1) Field of the Invention

The invention relates to the general area of programmable logic and memory, more particularly to antifuses for use in those technologies.

(2) Description of the Prior Art

In recent years the popularity of field programmable logic and write-once memories has grown significantly. These systems are generally based on antifuses. The latter are connections between wires that are initially open circuits but which can, through suitable external means, be selectively (and irreversibly) converted to short circuits.

One of the ways to activate an antifuse is by applying a suitable voltage (generally less than about 20 volts) across it. This causes the antifuse to change from its insulating to its conducting state in a few microseconds. For a typical antifuse of the current art, having an area of about 4–10 square microns, the resistance in the open state will be about $10^9$–$10^{12}$ ohms while the resistance in the conducting state will be about 50–500 ohms.

Many antifuse systems are based on amorphous silicon, which has high resistivity, but which, after heating, recrystallizes and drops its resistivity substantially. An example of this type of antifuse is given by Roesner (U.S. Pat. No. 4,796,074 January 1989). Other types of material mentioned by Roesner include germanium, carbon and tin and all depend on a change in grain size from amorphous, or very small crystallites, to relatively large grains. An additional drop in resistivity is achieved by the activation of interstitial dopant atoms (such as might be introduced through ion implantation). Thus Roesner teaches that the maximum temperature to which antifuse material may be exposed during processing must be less than about 600° C.

A number of improvements in the details of how to manufacture antifuses of the amorphous silicon type have been described by Dixit (U.S. Pat. No. 5,322,812 June 1994). Of particular importance is the maintenance of a high level of cleanliness. The maximum processing temperature is kept to about 540° C. and great care is taken to avoid the presence of nitrogen since small amounts of silicon nitride were found to degrade the performance of the antifuses.

Some other examples of antifuses based on amorphous silicon include those disclosed by Favreau (U.S. Pat. No. 5,412,245 May 1995), Iranmanesh (U.S. Pat. No. 5,440,167 August 1995), Lee et al. (U.S. Pat. No. 5,447,880 September 1995), and Holzworth et al. (U.S. Pat. No. 5,384,481 January 1995). The structures disclosed in these patents are all built on the idea of placing the antifuse at the bottom and along the sides of a hole. This implies multiple processing steps in the formation of the complete antifuse structure as well as the introduction of potential failure points where various layers associated with the antifuse cross the edge of the hole. Additionally, this approach presents some difficulties when scaling down in size.

In FIG. 1 we show a typical antifuse structure illustrative of the current art (taken from the Holzworth patent cited above). Aluminum layer 2 has been deposited on silicon oxide layer 1. First refractory metal layer 3 lies on layer 2 while etch stop layer 4 lies on top of it. This is all covered by silicon oxide layer 5 in which hole 6 has been formed. Layer 7 comprises the antifuse material itself (amorphous silicon) while layers 8 and 9 comprise second refractory metal and aluminum layers respectively.

It should also be mentioned that there is at least one alternative antifuse system to the amorphous semiconductor variety discussed above. This is one that is based on oxide-nitride-oxide (ONO). ONO comprises a structure of three layers—silicon oxide, silicon nitride, and silicon oxide. When such a structure is subjected to a suitable applied voltage (typically about 16 volts) its resistance changes from about $10^{12}$ ohms to about 500 ohms.

SUMMARY OF THE INVENTION

It has been an object of the present invention to provide an antifuse structure that has improved characteristics relative to similar antifuse structures known to the prior art.

Another object of the present invention has been to provide an antifuse structure that requires fewer steps in its manufacture and therefore has lower cost than similar antifuse structures known to the prior art.

Yet another object of the present invention has been to provide a method for manufacturing said antifuse structure.

A still further object of the present invention has been to provide an antifuse structure that has improved reliability relative to similar antifuse structures known to the prior art.

These objects have been achieved in a structure comprising a pair of alternating layers of silicon nitride and amorphous silicon sandwiched between two dual damascene connectors. Said structure provides the advantage, over the prior art, that all electrically active surfaces of the fuse structure are planar, so no potential failure spots resulting from surface unevenness can be formed. A process for manufacturing said fuse structure is provided and involves fewer masking steps than related structures of the prior art.

BRIEF DESCRIPTION OF THE DRAWINGS

FIG. 1 shows a typical antifuse structure of the prior art.

FIG. 2 is the starting point of a process for the manufacture of an antifuse structure according to the present invention.

DESCRIPTION OF THE PREFERRED EMBODIMENTS

Figure 5:
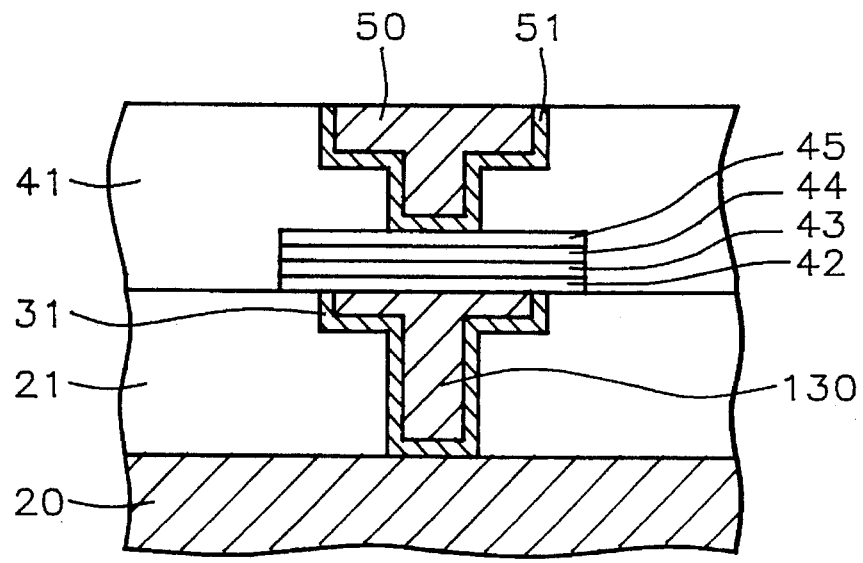
FIG. 5 shows the finished structure that comprises the antifuse of the present invention.

The present invention is an antifuse system based on amorphous silicon but incorporating a number of changes and improvements relative to the current art discussed earlier. FIG. 5 is a schematic cross-section of a preferred embodiment of the present invention. Said embodiment comprises layers 42 and 44 of silicon nitride, alternating with layers 43 and 45 of amorphous silicon, sandwiched between a pair of dual damascene connectors 130 and 50, immersed in insulating layers 21 and 41 respectively. The term 'dual damascene' will be further defined in the course of describing the preferred process for manufacturing the present invention. The choice of alternating layers of amorphous silicon and silicon nitride for the fusing element, as opposed to a single layer of amorphous silicon (see FIG. 1), is based on its reliability and its improved ability for being scaled down. The top layer of amorphous silicon is used to improve selectivity during via etching.

We begin a description of a preferred method for manufacturing the present invention by making reference to FIG. 2. The process begins with the provision of a partially completed integrated circuit (not shown) on whose surface is conductive layer 20 which is between about 0.5 and 1 microns thick. Insulating layer 21 is deposited onto layer 20 to a thickness between about 0.6 and 1.5 microns. Using a suitable photoresist mask (not shown) trench 22 (between about 0.4 and 0.8 microns deep and running at right angles to the plane of the figure) is etched into the surface of 21. Then, using a second photoresist mask (also not shown) a cavity 23 is etched in layer 21, starting at the bottom of trench 22. Said cavity 23 extends all the way through 21 to the surface of conductive layer 20. Cavity 23 is generally cylindrical in shape, with a diameter between about 0.18 and 1 microns, and is centrally positioned within trench 22.

Figure 3:
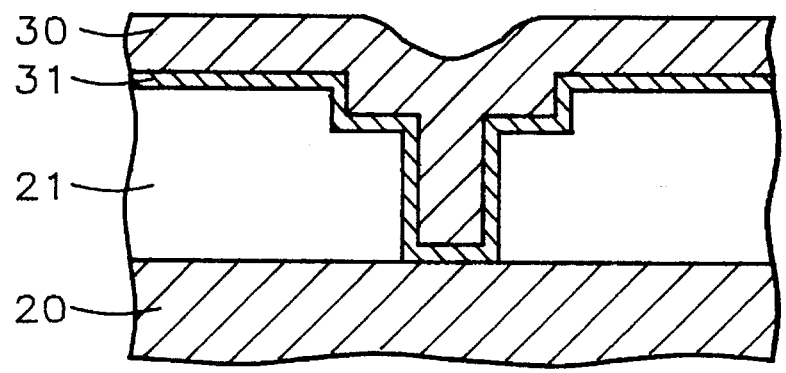
FIGS. 3 and 4 show intermediate steps in said process.

Referring now to FIG. 3, barrier layer 31 comprising titanium nitride, titanium tungsten, or tantalum nitride, is deposited by Physical Vapor Deposition (PVD) onto insulating layer 21 as well as onto all the walls of trench 22 and cavity 23 to a thickness between about 200 and 1,200 Angstroms. The purpose of the barrier layer is to prevent interdiffusion and to promote adhesion. This is followed by the deposition of second conductive layer 30, comprising aluminum, copper, tungsten, or silver, using PVD or Chemical Vapor Deposition (CVD) to a thickness sufficient to more than fill both cavity and trench. An optional reflow process, to improve cavity filling, may be added after the deposition of the metal.

Figure 4:
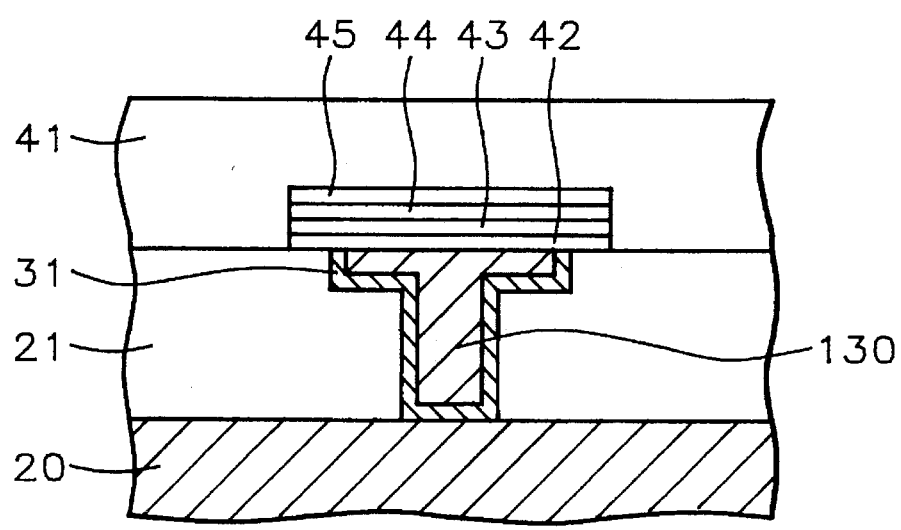

Referring now to FIG. 4, the structure is planarized, using a standard technique such as chemical-mechanical polishing, by the removal of layer 30 down to the level of layer 21, including those parts of layer 31 that are not coating the sidewalls of former trench 22 and former cavity 23. This results in the formation of dual damscene connector (DDC) 130 which comprises two parts —a trench part (where layer 30 filled in former trench 22) and a stud part (where layer 30 filled in former cavity 23). The term damscene refers to the fact that a layer has been inlaid within a supporting medium, as opposed to being covered by it. In this instance, the area for receiving the inlaid conductor was formed in two separate steps, hence the term dual damascene.

Continuing our reference to FIG. 4, alternating layers 42 and 44 of silicon nitride and 43 and 45 of amorphous silicon are now deposited onto layer 21 and onto the exposed upper surface of DDC 130. The thicknesses of these layers are between about 50 and 200 Angstroms for layer 42, between about 200 and 1,200 Angstroms for layer 43, between about 50 and 200 Angstroms for layer 44, and between about 100 and 500 Angstroms for layer 45. The four layers are now patterned and etched so that they are removed everywhere, except directly over DDC 130 which they overhang by a small amount, so that they now have the shape of a pedestal that is slightly longer than the width of trench 22 and slightly wider than cavity 23. The structure is then coated with a second layer 41 of insulating material to a thickness between about 0.6 and 1.5 microns.

Referring now to FIG. 5, second DDC 50, including its own barrier layer 51, is now formed in insulating layer 41 in the same manner as was described above for the first DDC. DDC 50 extends from the upper surface of insulating layer 41 down to amorphous silicon layer 45, to which it makes electrical contact. This completes our description of the process for manufacturing a preferred embodiment of the present invention.

Figure 6:
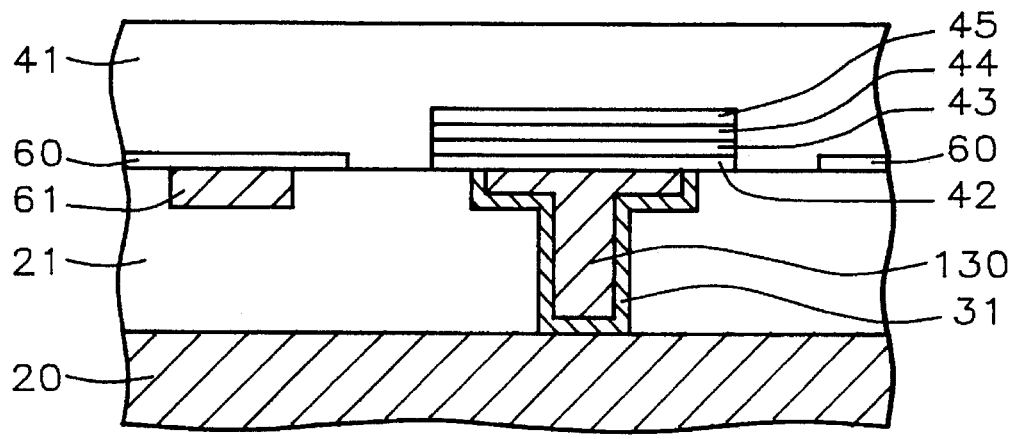
FIG. 6 shows a second embodiment of the present invention.

Another embodiment of the present invention may be prepared by a small modification of the above process and is illustrated in FIG. 6. Prior to the deposition of the four layer silicon nitride/amorphous silicon fusing element, process control layer 60, comprising silicon oxide, tantalum oxide, or aluminum oxide, is deposited to a thickness between about 400 and 2,000 Angstroms over the structure, including the upper surfaces of insulating layer 21 and DDC 130. An opening is then etched in layer 60 so as to fully expose the upper surface of DDC 130 and formation of the four layer fusing element proceeds as before. The purpose of layer 60 is to act as a diffusion barrier for an adjoining single damascene conductor such as 61. It is also used as an etch stopper during the etching of the four layer structure.

It has been our experience that the antifuse structure of the present invention has a number of advantages over similar structures associated with the current art. These advantages are summarised below in TABLE I.

TABLE I

|  | ONO prior art | amorhpous Si prior art | amorphous Si this invn. |
| --- | --- | --- | --- |
| open R | $10^{11}$–$10^{13}$ ohms | $10^8$–$10^9$ ohms | $10^8$–$10^{10}$ ohms |
| short R | 200–1,000 ohms | 20–100 ohms | 20–100 ohms |
| forming V | 10–20 volts | 8–12 volts | 8–12 volts |
| cost | HIGH | LOW | LOW |
| reliability | GOOD | MODERATE | GOOD |

While the invention has been particularly shown and described with reference to the preferred embodiments thereof, it will be understood by those skilled in the art that various changes in form and details may be made without departing from the spirit and scope of the invention.

What is claimed is:

1. A method for manufacturing an antifuse structure comprising:

(a) providing a first conductive layer;

(b) depositing a first insulating layer on said first conductive layer;

(c) patterning and then etching said first insulating layer thereby forming a trench therein;

(d) patterning and then etching said first insulating layer, including said trench, thereby forming a cavity extending from inside said trench down to the level of said first conductive layer;

(e) depositing a barrier layer on said first insulating layer and on all walls of said trench and said cavity;

(f) depositing a second conductive layer so as to more than fill said cavity and said trench;

(g) removing said second conductive layer and said barrier layer as far as the level of said first insulating layer, thereby forming a first dual damscene connector having an upper surface;

(h) depositing a first layer of silicon nitride on the antifuse structure;

(i) depositing a first layer of amorphous silicon on said first layer of silicon nitride;

(j) depositing a second layer of silicon nitride on said first layer of amorphous silicon;

(k) depositing a second layer of amorphous silicon on said second layer of silicon nitride;

(l) patterning and then etching said first and second layers of silicon nitride and amorphous silicon to form a pedestal that overlaps said first dual damascene connector;

(m) depositing a second insulating layer on said first insulating layer and on said second layer of amorphous silicon; and (n) forming a second dual damascene connector that extends through said second insulating layer down to, and making electrical contact to, said second layer of amorphous silicon.

2. The method of claim 1 wherein the method for removing said second conductive layer and said barrier layer comprises chemical-mechanical polishing.

3. The method of claim 1 wherein said second conductive layer comprises material taken from the group consisting of aluminum, copper, tungsten, and silver.

4. The method of claim 1 wherein said barrier layer comprises material taken from the group consisting of titanium nitride, titanium tungsten, tantalum nitride, and tungsten nitride.

5. The method of claim 1 wherein the thickness of said barrier layer is between about 200 and 1,200 Angstroms.

6. The method of claim 1 further comprising, between steps (g) and (h):

depositing a process control layer over the antifuse structure; and etching an opening in said process control layer to fully expose the upper surface of said dual damascene connector.

7. The method of claim 6 wherein said process control layer comprises material taken from the group consisting of silicon oxide, tantalum oxide, and aluminum oxide.

8. The method of claim 6 wherein the thickness of said process control layer is between about 400 and 2,000 Angstroms.

* * * * *